(12) United States Patent
Takeuchi et al.

(10) Patent No.: US 7,700,972 B2
(45) Date of Patent: Apr. 20, 2010

(54) SEMICONDUCTOR DEVICE

(75) Inventors: Hideo Takeuchi, Tokyo (JP);
Yoshitsugu Yamamoto, Tokyo (JP)

(73) Assignee: Mitsubishi Electric Corporation,
Tokyo (JP)

( * ) Notice: Subject to any disclaimer, the term of this patent is extended or adjusted under 35 U.S.C. 154(b) by 42 days.

(21) Appl. No.: 12/143,053

(22) Filed: Jun. 20, 2008

(65) Prior Publication Data

US 2009/0218578 A1    Sep. 3, 2009

(30) Foreign Application Priority Data

Mar. 3, 2008   (JP) ............................. 2008-052409

(51) Int. Cl.
*H01L 29/205*   (2006.01)
*H01L 29/778*   (2006.01)
(52) U.S. Cl. ............................. 257/192; 257/E29.091
(58) Field of Classification Search .................. 257/76, 257/192, 195, E29.091
See application file for complete search history.

(56) References Cited

U.S. PATENT DOCUMENTS

| 2005/0023555 A1* | 2/2005 | Yoshida et al. | 257/192 |
| 2008/0315257 A1* | 12/2008 | Shiraishi | 257/195 |
| 2009/0008677 A1* | 1/2009 | Kikkawa | 257/194 |
| 2009/0218598 A1* | 9/2009 | Goto | 257/192 |

FOREIGN PATENT DOCUMENTS

| JP | 8-264762 | 10/1996 |
| JP | 2002-64183 | 2/2002 |

OTHER PUBLICATIONS

N. Inoue et al.: "Surface Control of Bottom Electrode in Ultra-Thin SiN Metal-Insulator-Metal Decoupling Capacitors for High Speed Processors", Japanese Journal of Applied Physics, vol. 46, No. 4B, 2007, pp. 1968-1973.
L. Roskovcova et al.: "The Urbach Absorption Edge in AlN", Czech. J. Phys., B30 [1980], pp. 586-591.
A.T. Collins et al.: "Lattice Vibration Spectra of Aluminum Nitride", Physical Review vol. 158, No. 3, Jun. 15, 1967, pp. 833-838.
Jerry L. Hudgins: Wide and Narrow Bandgap Semiconductors for Power Electronics: A New Valuation Journal of Electronic Materials, vol. 32, No. 6, 2003, pp. 471-477.

* cited by examiner

*Primary Examiner*—W. David Coleman
*Assistant Examiner*—Christine Enad
(74) *Attorney, Agent, or Firm*—Leydig, Voit & Mayer, Ltd.

(57) ABSTRACT

A semiconductor device comprises an AlN layer, a GaN layer, and an AlGaN layer sequentially formed on a semiconductor substrate. A first opening extends through said GaN layer and said AlGaN layer and exposes part of an upper surface of the AlN layer. A second opening extends through the semiconductor substrate and exposes a part of a lower surface of the AlN layer, in a location facing the first opening. A upper electrode is exposed on an upper surface of the AlN layer in the first opening; and a lower electrode is disposed on a lower surface of the AlN layer in the second opening.

3 Claims, 4 Drawing Sheets plasma etching

//SEMICONDUCTOR DEVICE

BACKGROUND OF THE INVENTION

1. Field of the Invention

The present invention relates to a semiconductor device wherein the laminated structure of nitride semiconductors is formed, and more specifically, to a semiconductor device that can ensure sufficient capacitance and withstand voltage without enlarging a chip area.

2. Background Art

A nitride semiconductor is the generic term for gallium nitride (GaN), aluminum nitride (AlN), indium nitride (InM), and mixed crystals composed of these nitrides. Generally, the nitride semiconductor is mechanically robust and chemically stable, and has high thermal conductivity and excellent heat dissipation properties. Therefore, a semiconductor element fabricated using a nitride semiconductor multilayer film structure, for example, an $Al_xGa_{1-x}N$/GaN high electron mobility transistor (HEMT) is considered to be applied to a high output high-frequency element. Therefore, a large number of trial products of AlGaN/GaN HEMTs have been reported.

A circuit using an AlGaN/GaN HEMT can be used as a monolithic microwave integrated circuit (MMIC) in the same way as other high-frequency transistors. For fabricating an MMIC, the structure and the fabricating method of passive elements, such as a resistor, an inductor, and a capacitor, other than transistors are important. In conventional metal insulator metal (MIM) capacitors, a silicon nitride ($SiN_x$) film is deposited on an underlying metal layer by a chemical gas-phase growing method, and is used as an insulating film.

The breakdown electric field of the $SiN_x$ film is not more than about 6 MV/cm (for example, refer to N. Inoue, Ippei Kume, Jun Kawahara, Shinobu Saito, Naoya Furutake, Takeshi Toda, Koichiro Matsui, Takayuki Iwaki, Masayuki Furumiya, Toshiki Shinmura, Koichi Ohto, and Yoshihiro Hayashi, Jpn. J. Appl. Phys. 46, 1968 (2007)). Therefore, the breakdown voltage of an MIM capacitor using a normal $SiN_x$ film of a thickness of 150 nm is about 90 V, and is insufficient for withstanding voltage as a capacitor for the MMIC of an AlGaN/GaN HEMT. When the $SiN_x$ film is thickened in order to make the break down voltage higher, the capacitance is lowered in proportional to the film thickness; therefore, the area of the capacitor must be enlarged. If the sufficient capacitance and withstand voltage are to be ensured, a problem of enlarged chip area is caused.

SUMMARY OF THE INVENTION

To solve the above-described problem, it is an object of the present invention to provide a semiconductor device that can ensure sufficient capacitance and withstand voltage without enlarging a chip area.

According to one aspect of the present invention, a semiconductor device comprises an AlN layer, a GaN layer, and an AlGaN layer sequentially formed on a semiconductor substrate, wherein a first opening is formed through said GaN layer and said AlGaN layer so as to expose a part of the upper surface of said AlN layer; a second opening is formed through said semiconductor substrate so as to expose a part of the lower surface of said AlN layer, in a location facing said first opening; an upper electrode is formed on the upper surface of said AlN layer in said first opening; and a lower electrode is formed on the lower surface of said AlN layer in said second opening.

According to the present invention, a semiconductor device that can ensure sufficient capacitance and withstand voltage without enlarging a chip area can be provided.

Other and further objects, features and advantages of the invention will appear more fully from the following description.

DETAILED DESCRIPTION OF THE PREFERRED EMBODIMENTS

First Embodiment

Figure 1:
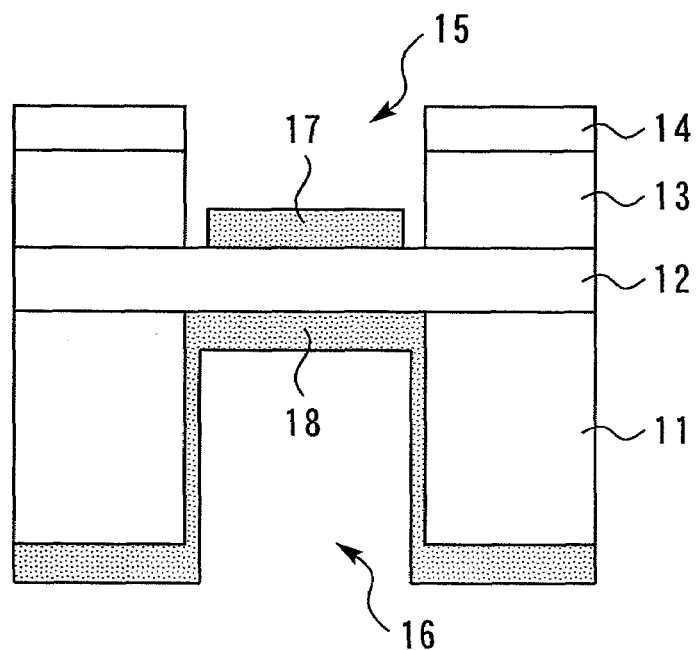
FIG. 1 is a sectional view showing a semiconductor device according to the first embodiment.

FIG. 1 is a sectional view showing a semiconductor device according to the first embodiment. The semiconductor device is an MMIC having an HEMT of an AlGaN/GaN hetero epitaxial structure and an MIM capacitor. Here, the illustration and description about the configuration of the HEMT will be omitted.

An AlN layer 12, a GaN layer 13, and an AlGaN layer 14 are sequentially formed on an SiC substrate 11 (semiconductor substrate). A first opening 15 is formed through the GaN layer 13 and the AlGaN layer 14 so as to expose a part of the upper surface of the AlN layer 12. A second opening 16 is formed through the SiC substrate 11 so as to expose a part of the lower surface of the AlN layer 12, in a location facing the first opening 15.

An upper electrode 17 is formed on the upper surface of the AlN layer 12 in the first opening 15; and a lower electrode 18 is formed on the lower surface of the AlN layer 12 in the second opening 16. An MIM capacitor is composed of the upper electrode 17, the AlN layer 12, and the lower electrode 18.

Figure 2:
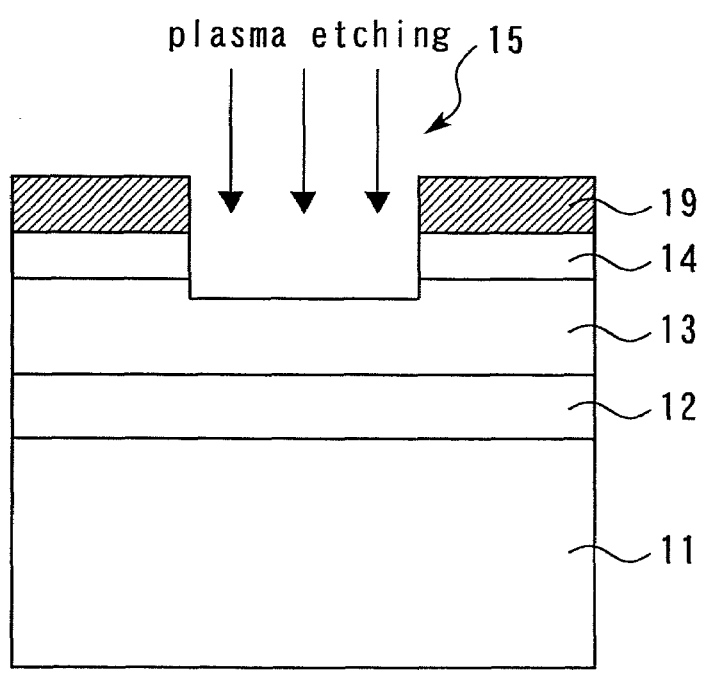
FIGS. 2-4 are sectional views for explaining a method of manufacturing semiconductor device according to the first embodiment.

The manufacturing process of the above-described semiconductor device will be described. First, as shown in FIG. 2, an AlN layer 12, a GaN layer 13, and an AlGaN layer 14 are sequentially epitaxially grown on an SiC substrate 11. Then, on the AlGaN layer 14, a resist 19 patterned by photolithography is formed. Using the resist 19 as a mask, the AlGaN layer 14 and the GaN layer 13 are etched to form a first opening 15. As the etching gas, for example, $Cl_2$ plasma having an etching ability to AlGaN and GaN is used. After conducting etching for a time estimated from the etching rate that the etching does not reach the AlN layer 12, $O_2$ plasma is introduced. Since a stable $AlO_x$ layer is formed by reacting with the $O_2$ plasma on the surface of the AlN layer 12, etching is stopped.

Figure 3:
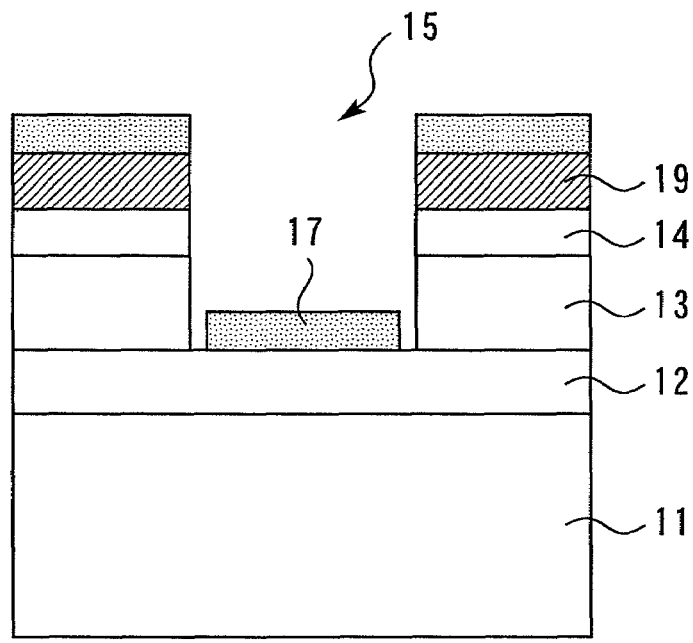

Next, as shown in FIG. 3, an upper electrode 17 of the MIM capacitor is formed on the upper surface of the AlN layer 12 in the first opening 15 by depositing a metal film.

After the entire surface process to the surface of the wafer in the HEMT has been completed, a back-face process to the back-face of the wafer is carried out. Upon this back-face process, a lower electrode 18 of the capacitor is formed.

Figure 4:
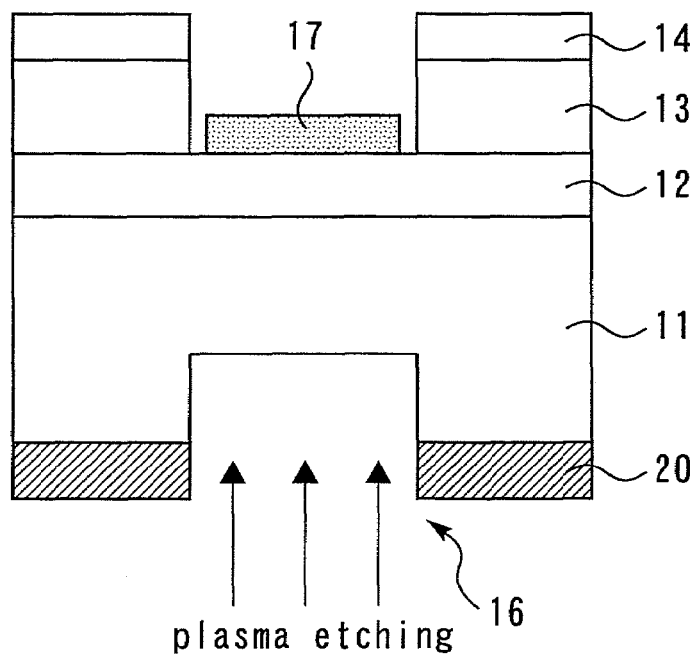

Specifically, as shown in FIG. 4, a resist 20 patterned by photolithography is formed on the back-face of the SiC substrate 11. Using the resist 20 as a mask, the SiC substrate 11 is etched from the back-face by $SF_6/O_2$ plasma to form a second opening 16. When etching reaches the AlN layer 12, the etching stops due to the difference in etching-rate ratio between SiC and AlN to the $SF_6/O_2$ plasma.

Thereafter, a metal film is deposited to form a lower electrode 18 of the MIM capacitor on the lower surface of the AlN layer 12 in the second opening 16. By the above-described steps, a semiconductor device according to the first embodiment is formed.

Here, the band gap energy of AlN is 6.28 eV at a room temperature (300 K) (for example, refer to L. Roskovcova and J. Pastrnak, Czech. J. Phys. B 30, 586 (1980)); and the static dielectric constant thereof is 9.14 (for example, refer to A. T. Collins, E. C. Lightowlers, and P. J. Dean, Phys Rev. 158, 833 (1967)). These values are both larger than the band gap energy of $SiN_x$ (not more than 5 eV), and the static dielectric constant thereof (not more than 7). The breakdown voltage generally elevates in proportional to second to 2.5th power of the band gap energy (for example, refer to J. L. Hudgins, J. Electron. Mater. 32, 471 (2003)). In the case of AlN, the breakdown field is theoretically estimated to be about 9.5 MV/cm. Therefore, when an MIM capacitor having the same capacitance and areas as the MIM capacitor using an $SiN_x$ film of a thickness of 150 nm as the insulating film is fabricated, breakdown voltage as high as about 190 V can be achieved by designing the thickness of the AlN layer 12 to be 200 nm. Therefore, sufficient capacitance and withstand voltage can be ensured without enlarging the chip area.

When the AlGaN/GaN hetero structure is epitaxially grown, an AlN layer is normally grown on the SiC substrate as the nucleation layer and the buffer layer. This is because epitaxial growth to achieve favorable crystallinity cannot be performed without the nucleation layer and the buffer layer. Therefore, by using the AlN layer as an insulating film for the MIM capacitor, the formation of a separate insulation film is not required.

Although an SiC substrate is used in the first embodiment, the present invention is not limited thereto, but a GaN substrate can also be used. In this case, if a mixed plasma of $Cl_2$ and $O_2$ is used when the GaN substrate is etched from the back-face, etching can be stopped at the AlN layer.

Second Embodiment

Figure 5:
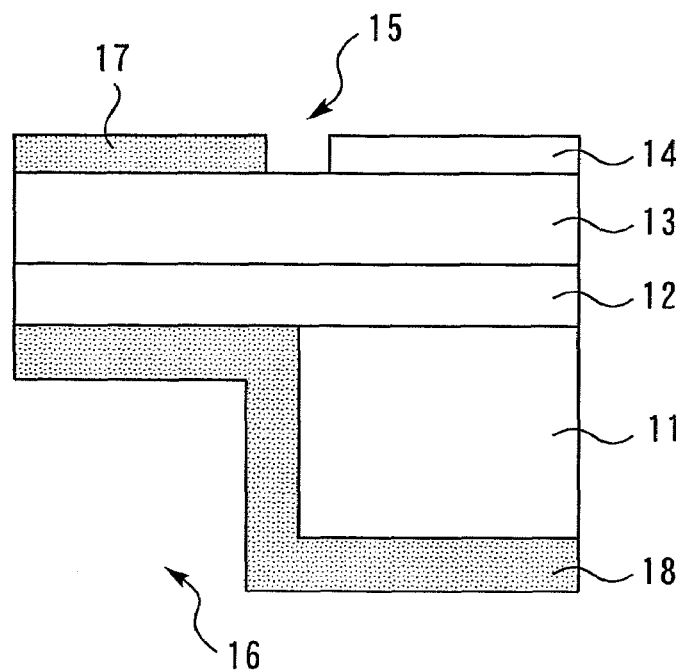
FIG. 5 is a sectional view showing a semiconductor device according to the second embodiment.

FIG. 5 is a sectional view showing a semiconductor device according to the second embodiment. The semiconductor device is an MMIC having an HEMT of an AlGaN/GaN hetero epitaxial structure and an MIM capacitor. Here, the illustration and description about the configuration of the HEMT will be omitted.

An AlN layer 12, a GaN layer 13, and an AlGaN layer 14 are sequentially formed on an SiC substrate 11 (semiconductor substrate). A first opening 15 is formed through the AlGaN layer 14 so as to expose a part of the upper surface of the GaN layer 13. A second opening 16 is formed through the SiC substrate 11 so as to expose a part of the lower surface of the AlN layer 12, in a location facing the first opening 15.

An upper electrode 17 is formed on the upper surface of the AlN layer 12 in the first opening 15; and a lower electrode 18 is formed on the lower surface of the AlN layer 12 in the second opening 16. An MIM capacitor is composed of the upper electrode 17, the AlN layer 12, the GaN layer 13 and the lower electrode 18. However, the GaN layer 13 is thin so as not to affect the capacitance of the MIM capacitor.

In AlGaN/GaN hetero epitaxial structures, there are various structures depending on characteristics. The present embodiment is applied when the GaN layer 13 is thin so as not to affect the capacitance of the MIM capacitor. However, the AlGaN layer 14, which generates a two-dimensional electron gas must be removed. By this configuration, the effect equivalent to the effect of the first embodiment can be achieved.

Third Embodiment

Figure 6:
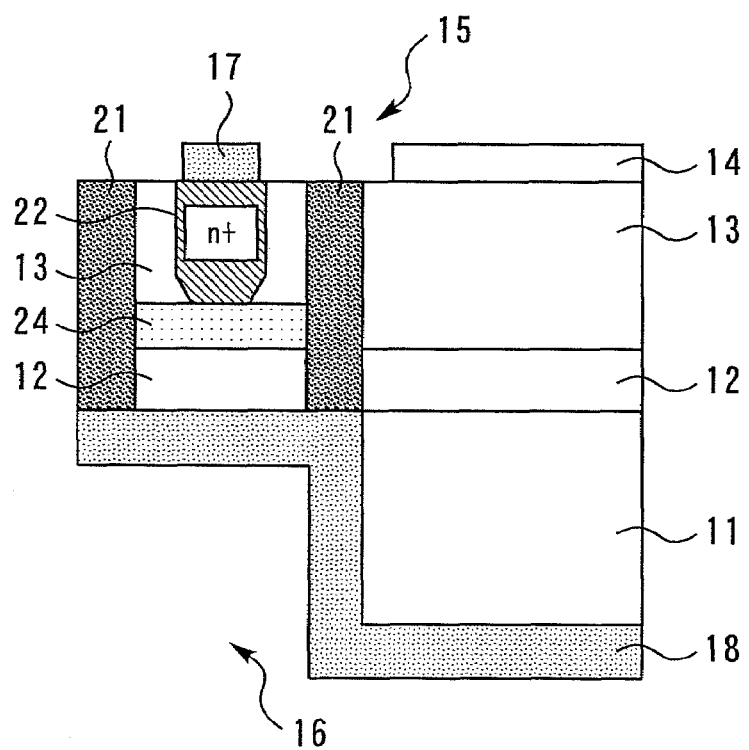
FIG. 6 is a sectional view showing a semiconductor device according to the third embodiment.

FIG. 6 is a sectional view showing a semiconductor device according to the third embodiment. Only the configuration different from the configuration of the second embodiment will be described.

The GaN layer 13 is not as thin as that in the second embodiment. By the design of the AlGaN/GaN hetero epitaxial structure, a two-dimensional electron gas layer 24 is formed in the interface between the AlN layer 12 and the AlGaN layer 14. An impurity diffused layer 22 is formed in the GaN layer 13 by ion implantation so as to be connected with the two-dimensional electron gas layer 24. An upper electrode 17 is formed on the impurity diffused layer 22. An element isolating region 21 is formed in the periphery of the region to be an MIM capacitor by insulation implantation.

Since a bias can be applied to the two-dimensional electron gas layer 24 from the exterior via the impurity diffused layer 22, the two-dimensional electron gas layer 24 functions as the lower electrode of the MIM capacitor. By this configuration, the effect equivalent to that of the first embodiment can be achieved.

Fourth Embodiment

Figure 7:
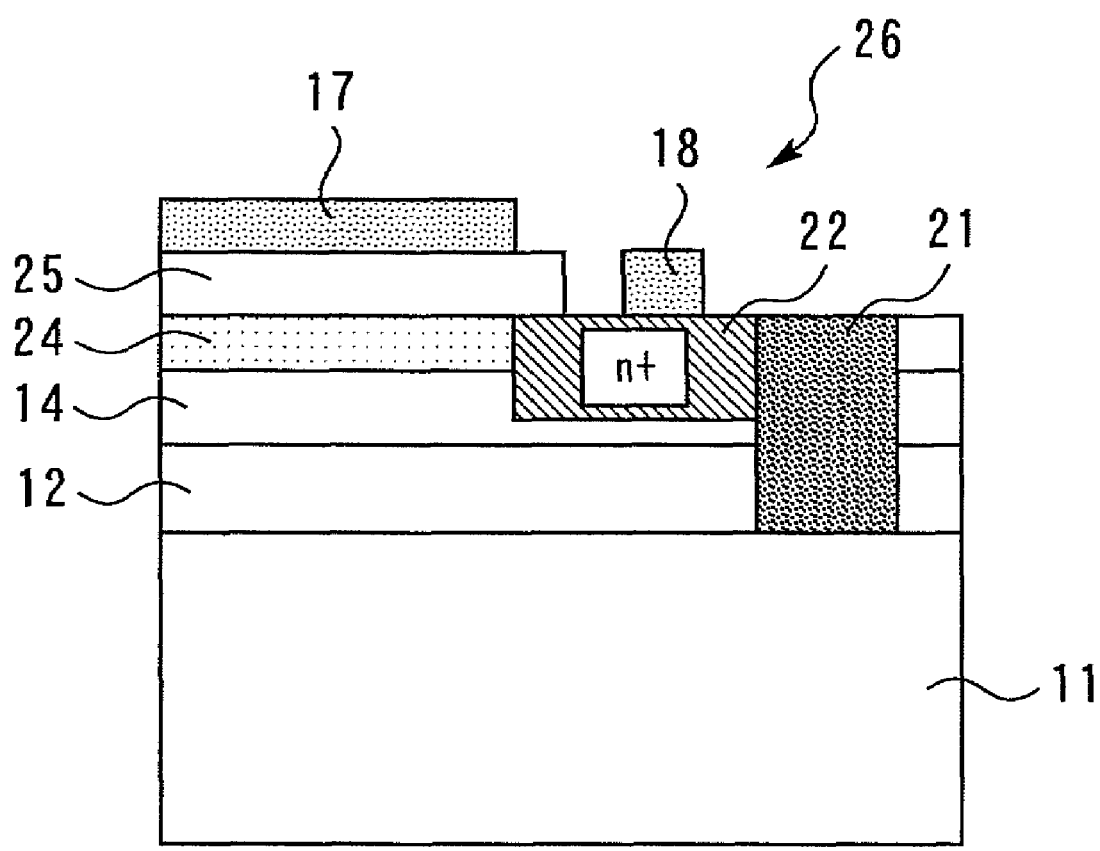
FIG. 7 is a sectional view showing a semiconductor device according to the fourth embodiment.

FIG. 7 is a sectional view showing a semiconductor device according to the fourth embodiment. The semiconductor device is an MMIC having an HEMT of an AlGaN/AlN hetero epitaxial structure and an MIM capacitor. Here, the illustration and description about the configuration of the HEMT will be omitted.

An AlN layer 12, an AlGaN layer 14, and an AlN layer 25 are sequentially formed on an SiC substrate 11 (semiconductor substrate). An opening 26 is formed through the AlN layer 25 so as to expose a part of the upper surface of the AlGaN layer 14. An element isolating region 21 is formed in the periphery of the region to be an MIM capacitor by insulation implantation.

In the case of the AlGaN/AlN structure, a two-dimensional electron gas layer 24 is formed in the interface between the AlGaN layer 14 and the AlN layer 25. An impurity diffused layer 22 is formed in the AlGaN layer 14 in the opening 26 so as to be connected with the two-dimensional electron gas layer 24. An upper electrode 17 is formed on the AlN layer 25, and the lower electrode 18 is formed on the impurity diffused layer 22.

An MIM capacitor is composed of an upper electrode 17, the AlN layer 25, and the lower electrode 18. However, since a bias can be applied to the two-dimensional electron gas layer 24 from the exterior via the impurity diffused layer 22, the two-dimensional electron gas layer 24 functions as the lower electrode of the MIM capacitor. By this configuration, the effect equivalent to the effect of the first embodiment can be achieved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-052409, filed on Mar. 3, 2008 including specification, claims, drawings and summary, on which the Convention priority of the present application is based, are incorporated herein by reference in its entirety.

What is claimed is:

1. A semiconductor device comprising:
a semiconductor substrate; and
an AlN layer, a GaN layer, and an AlGaN layer sequentially disposed on said semiconductor substrate, wherein
a first opening extends through said GaN layer and said AlGaN layer and exposes a part an upper surface of said AlN layer;
a second opening extends through said semiconductor substrate and exposes a part a lower surface of said AlN layer, in a location facing said first opening,
an upper electrode is disposed on the upper surface of said AlN layer, in said first opening, and
a lower electrode is disposed on the lower surface of said AlN layer, in said second opening.

2. A semiconductor device comprising:
a semiconductor substrate; and
an AlN layer, a GaN layer, and an AlGaN layer sequentially disposed on said semiconductor substrate, wherein
a first opening extends through said AlGaN layer and exposes a part of an upper surface of said GaN layer,
a second opening extends through said semiconductor substrate and exposes a part of a lower surface of said AlN layer, in a location facing said first opening,
an upper electrode is disposed on the upper surface of said GaN layer in said first opening, and
a lower electrode is disposed on the lower surface of said AlN layer, in said second opening.

3. The semiconductor device according to claim 2, wherein
a two-dimensional electron gas layer is formed at an interface of said AlN layer and said GaN layer;
an impurity region is located in said GaN layer and connected to said two-dimensional electron gas layer; and
said upper electrode is disposed on said impurity region.

* * * * *